(12) United States Patent
Mishima (10) Patent No.: US 10,002,110 B2
(45) Date of Patent: Jun. 19, 2018

(54) CORRECTION ARITHMETIC CIRCUIT AND A SIGNAL PROCESSOR

(71) Applicant: Rohm Co., Ltd., Kyoto (JP)

(72) Inventor: Kazuma Mishima, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days. days.

(21) Appl. No.: 15/372,521

(22) Filed: Dec. 8, 2016

(65) Prior Publication Data

US 2017/0091149 A1 Mar. 30, 2017

Related U.S. Application Data

(62) Division of application No. 14/729,153, filed on Jun. 3, 2015, now Pat. No. 9,552,329.

(30) Foreign Application Priority Data

Jun. 9, 2014 (JP) .................................. 2014-118364
Jun. 20, 2014 (JP) .................................. 2014-127332
Apr. 6, 2015 (JP) .................................. 2015-077389

(51) Int. Cl.
*G01F 15/06* (2006.01)
*G06F 17/17* (2006.01)
*H03K 3/011* (2006.01)
*H03K 23/66* (2006.01)

(52) U.S. Cl.
CPC ............. *G06F 17/17* (2013.01); *H03K 3/011* (2013.01); *H03K 23/665* (2013.01)

(58) Field of Classification Search
CPC ....................................................... G06F 17/17
See application file for complete search history.

(56) References Cited

U.S. PATENT DOCUMENTS

2011/0156774 A1* 6/2011 Ge ..................... H03L 1/027
327/156
2014/0094133 A1 4/2014 Li

FOREIGN PATENT DOCUMENTS

| JP | 2004-120353 | 4/2004 |
| JP | 2004-125685 | 4/2004 |
| JP | 2009-032142 | 2/2009 |

* cited by examiner

*Primary Examiner* — Daniel Puentes
(74) *Attorney, Agent, or Firm* — Fish & Richardson P.C.

(57) ABSTRACT

A correction arithmetic circuit disclosed herein includes an offset temperature characteristic correction unit that corrects an offset temperature characteristic of an input signal according to an input signal characteristic at a specific temperature and a temperature characteristic at a specific input signal. A signal processor disclosed herein includes a pulse count number setting circuit that generates a pulse count number setting signal in accordance with an input signal and a pulse generation unit that generates a pulse signal by counting a pulse number of a reference clock signal according to the pulse count number setting signal. The pulse count number setting circuit corrects the pulse count number setting signal so as to cancel a frequency temperature characteristic of the pulse signal.

9 Claims, 10 Drawing Sheets

CORRECTION ARITHMETIC CIRCUIT AND A SIGNAL PROCESSOR

CROSS-REFERENCE TO RELATED APPLICATIONS

This application is a divisional of U.S. patent application Ser. No. 14/729,153, filed Jun. 3, 2015 which claims priority to the following Japanese patent applications, the contents of which are hereby incorporated by reference: (1) Japanese Patent Application No. 2014-118364 (filing on Jun. 9, 2014), (2) Japanese Patent Application No. 2014-127332 (filing on Jun. 20, 2014), and (3) Japanese Patent Application No. 2015-077389 (filed on Apr. 6, 2015).

BACKGROUND OF THE INVENTION

1. Field of the Invention

The present invention relates to a correction arithmetic circuit and a signal processor.

2. Description of Related Art

In order to increase detection accuracy of a sensor, it is necessary to appropriately correct a sensor output characteristic that varies with temperature. For example, assume a case of correcting the sensor output characteristic at 60° C. with the sensor output characteristic at 20° C. used as a reference. In this case, an approximate formula representing the sensor output characteristic at 60° C. (a sensor output variation amount from the 20° C. reference) may be prepared beforehand, and a correction amount for correcting the sensor output may be calculated by using the approximate formula. When it is necessary to correct the sensor output characteristic at another temperature, another approximate formula may be prepared for the temperature in the same manner as above.

In regard to a signal processor that performs various signal processing functions synchronizing with a reference clock signal, in order to increase output accuracy of such a signal processor, it is desirable to prepare, as a clock signal generator, an oscillator having as small a frequency temperature characteristic as possible (that is, an oscillator whose oscillation frequency is not liable to vary with the ambient temperature).

Some examples of prior arts related to the above are disclosed in Japanese Patent Application Publications No. 2004-125685, 2009-032142, and 2004-120353.

However, in a case of a sensor having a wide range of operation temperature (for example, −40° C. through 140° C.), it is unrealistic from a viewpoint of circuit scale (memory capacity for storing coefficients of approximate formulae) to prepare an approximate formula for each temperature.

Moreover, the high price of highly accurate oscillators limits application to which such highly accurate oscillators are applicable. Conventionally, measures have been taken at the time of design such that resistor elements each having a positive or negative temperature characteristic, etc. are combined to thereby cancel a frequency temperature characteristic of an oscillator, but with such measures taken at the time of design, it is difficult to perform adjustment suitable for temperature characteristics of actual circuits.

SUMMARY OF THE INVENTION

In view of the above-mentioned problems found out by the inventor of the present application, an object of the invention disclosed herein is to provide a small-scale correction arithmetic circuit having a wide range of operation temperature.

In addition, in view of the above-mentioned problems found out by the inventor of the present application, another object of the invention disclosed herein is to provide a signal processor that does not require a highly accurate oscillator.

In order to achieve the above objects, according to an aspect of the present invention, a correction arithmetic circuit disclosed herein includes an offset temperature characteristic correction unit that corrects an offset temperature characteristic of an input signal according to an input signal characteristic at a specific temperature and a temperature characteristic at a specific input signal.

According to another aspect of the present invention, a signal processor disclosed herein includes a pulse count number setting circuit that generates a pulse count number setting signal in accordance with an input signal and a pulse generation unit that generates a pulse signal by counting a pulse number of a reference clock signal according to the pulse count number setting signal. Here, the pulse count number setting circuit is configured to correct the pulse count number setting signal so as to cancel a frequency temperature characteristic of the pulse signal.

Other features, components, steps, advantages, and characteristics of the present invention will be disclosed in the following detailed description of the best mode for carrying out the present invention and relevant attached drawings.

DETAILED DESCRIPTION OF PREFERRED EMBODIMENTS

<Electronic Apparatus>

Figure 1:
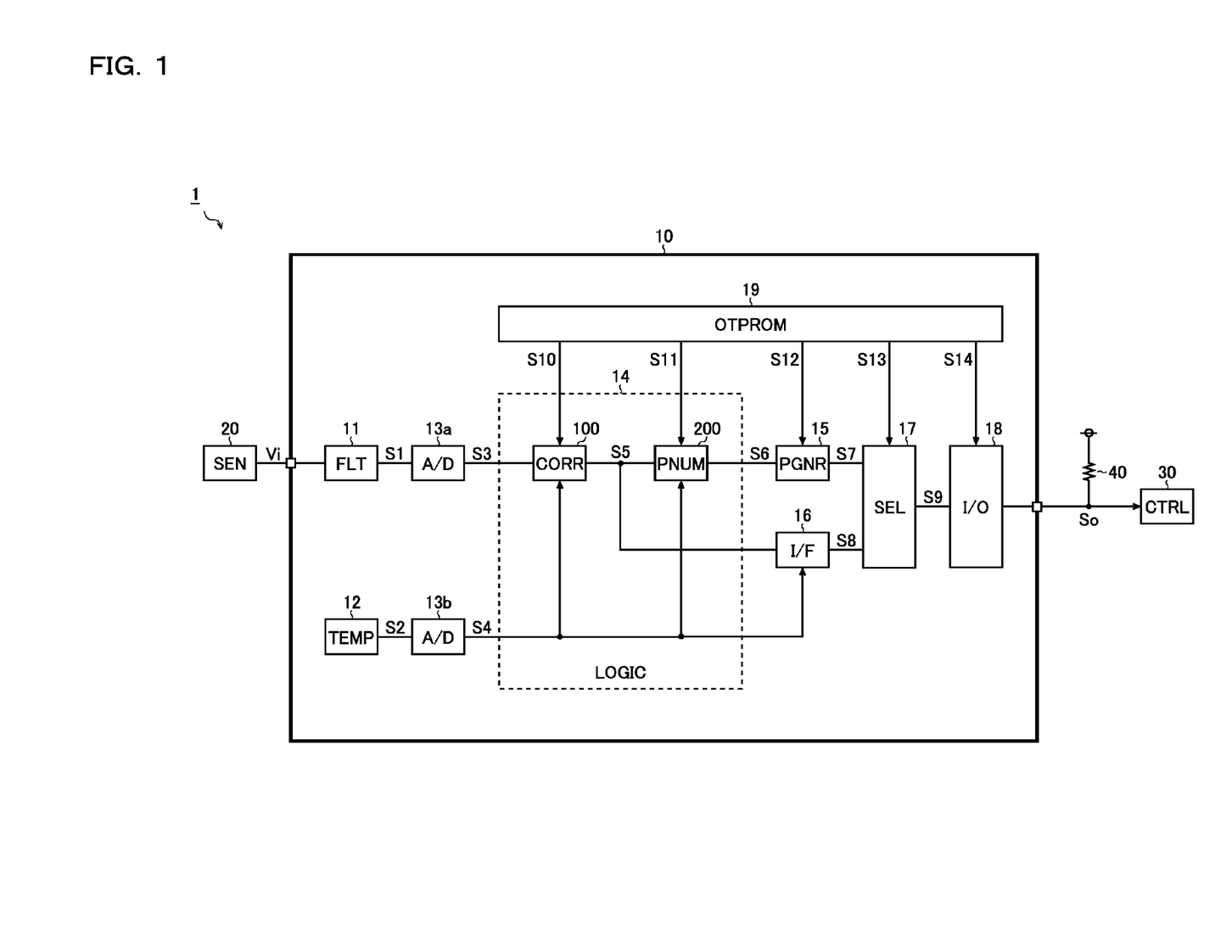
FIG. 1 is a block diagram showing a configuration example of an electronic apparatus.

FIG. 1 is a block diagram showing a configuration example of an electronic apparatus. The electronic apparatus 1 of the present configuration example includes a signal processor 10, a sensor 20, a controller 30, and a pull-up resistor 40. It should be noted that examples of the electronic apparatus 1 to which the present invention is applied include not only electronic apparatuses in a narrow sense such as information terminals and household electric appliances, but also vehicles, industrial machines, and the like.

The signal processor 10 is a semiconductor integrated circuit device that generates a sensor output signal So (a frequency signal having an oscillation frequency in accordance with a sensor input signal Vi, or a digital signal having an encode value in accordance with the sensor input signal Vi) in accordance with the sensor input signal Vi (an analog voltage signal) from the sensor 20.

The sensor 20 corresponds to a signal source that generates the sensor input signal Vi to be fed to the signal processor 10. Examples of the sensor 20 include an air flow sensor, a pressure sensor, a current sensor, etc.

Here, the signal processor 10 and the sensor 20 may be provided each as individual elements, or may be provided in a package as a single sensor module.

The controller 30 receives input of the sensor output signal So, and thereby obtains a result of measurement (air flow rate, pressure, or current amount, for example) performed by the sensor 20.

The pull-up resistor 40 pulls an open drain output terminal of the signal processor 10, from which the sensor output signal So is outputted, up to a power supply line.

<Signal Processor>

Next, continuously referring to FIG. 1, a detailed description will be given of an interior configuration of the signal processor 10. The signal processor 10 of the present configuration example includes, in an integrated manner, a filter unit 11, a temperature detection unit 12, an analog/digital conversion units 13a and 13b, a logic unit 14, a pulse generation unit 15, a single-line interface unit 16, a selector unit 17, an open drain output unit 18, and a storage unit 19. Besides these circuit blocks, the signal processor 10 further includes, in an integrated manner, a power supply unit, a sensor drive unit, a memory interface unit, etc., although not clearly shown in the present figure.

The filter unit 11 removes noise components (high frequency components) superimposed on the sensor input signal Vi, and thereby generates a filtered analog input signal S1. Preferably usable as the filter unit 11 is, for example, a low pass filter.

The temperature detection unit 12 generates an analog temperature signal S2 in accordance with an interior temperature (pn junction temperature) of the signal processor 10. Here, instead of, or together with, the temperature detection unit 12, an external temperature detection unit may be used which detects a temperature outside the signal processor 10 (ambient temperature around the sensor 20).

The analog/digital conversion unit 13a converts the analog input signal S1 into a digital input signal S3. The analog/digital conversion unit 13b converts the analog temperature signal S2 into a digital temperature signal S4. The analog/digital conversion units 13a and 13b may be integrated as a multi-input multi-output type analog/digital conversion unit.

The logic unit 14 includes a correction arithmetic circuit 100 and a pulse count number setting circuit 200, and generates a digital output signal S5 and a pulse count number setting signal S6 on receiving input of the digital input signal S3 and the digital temperature signal S4. For convenience of description, the present figure illustrates the correction arithmetic circuit 100 and the pulse count number setting circuit 200 as independent circuit blocks as if they were achieved in a hardware manner, but the correction arithmetic circuit 100 and the pulse count number setting circuit 200 are both achieved in a software manner by digital processing performed at the logic unit 14.

The correction arithmetic circuit 100 generates the digital output signal S5 by subjecting the digital input signal S3 to various kinds of correction processing (gain temperature characteristic correction processing, offset temperature characteristic correction processing, and a gain/offset absolute amount correction processing (voltage/frequency conversion processing)). Here, during the correction processing, the digital temperature signal S4 and a first correction parameter S10 are referred to as necessary.

The pulse count number setting circuit 200 generates the pulse count number setting signal S6 in accordance with the digital output signal S5 (a frequency value in accordance with the sensor input signal Vi). In doing so, the pulse count number setting circuit 200 corrects the pulse count number setting signal S6 so as to cancel a frequency temperature characteristic of a first pulse signal S7. In the correction processing, the digital temperature signal S4 and a second correction parameter S11 are referred to as necessary.

The pulse generation unit 15 generates the first pulse signal S7 by counting a pulse number of a reference clock signal CLK (unillustrated in the present figure) according to the pulse count number setting signal S6. The pulse generation unit 15 is equipped also with a function of adjusting a duty of the first pulse signal S7 according to a duty adjustment signal S12.

The single-line interface unit 16 generates a second pulse signal S8 in compliance with a single-line communication format (for example, a single edge nibble transmission (SENT) format) according to the digital output signal S5.

The selector unit 17 selectively outputs one of the first pulse signal S7 and the second pulse signal S8 as a selection pulse signal S9 according to an output switching signal S13. More specifically, when outputting a frequency signal having an oscillation frequency in accordance with the sensor input signal Vi as the sensor output signal So, the first pulse signal S7 is selected and outputted as the selection pulse signal S9. On the other hand, when outputting a digital signal having an encoding value in accordance with the sensor input signal Vi as the sensor output signal So, the second pulse signal S8 is selected and outputted as the selection pulse signal S9.

The open drain output unit 18 generates the sensor output signal So according to the selection pulse signal S9. The open drain output unit 18 is equipped also with a function of adjusting rising/falling slopes of the sensor output signal So according to a slew rate adjustment signal S14.

The storage unit 19 stores therein the first correction parameter S10, the second correction parameter S11, the duty adjustment signal S12, the output switching signal S13, and the slew rate adjustment signal S14 in a nonvolatile manner. Preferably usable as the storage unit 19 are, for example, a one-time programmable read-only memory (OTPROM), an electrically erasable programmable ROM (EEPROM), or a flash memory. Typical nonvolatile memories (an EEPROM, a flash memory, etc.) store data (0/1) by accumulating electrons in a floating gate, but the OTPROM stores data (0/1) by accumulating electrons in a sidewall. Since the sidewall is an insulator, it is difficult for electrons once stored therein to escape therefrom, and this makes the OTPROM superior to the floating gate type in retention characteristic.

<Correction Arithmetic Circuit>

Figure 2:
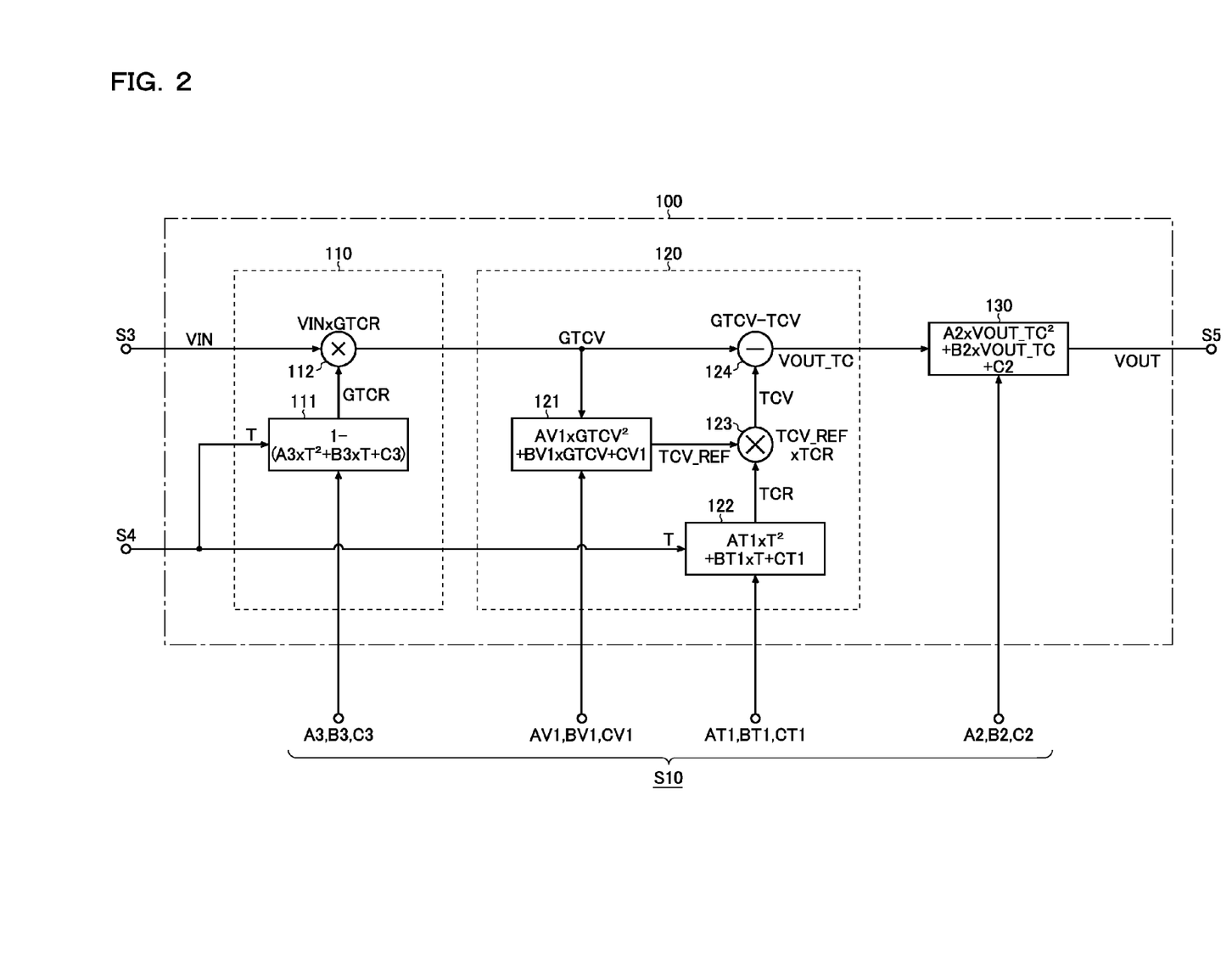
FIG. 2 is a block diagram showing a configuration example of a correction arithmetic circuit.

FIG. 2 is a block diagram showing a configuration example of the correction arithmetic circuit 100. The correction arithmetic circuit 100 of the present configuration example includes a gain temperature characteristic correction unit 110, an offset temperature characteristic correction unit 120, and a gain/offset absolute amount correction unit 130.

The gain temperature characteristic correction unit 110 is provided at a stage before the offset temperature characteristic correction unit 120, and generates an input signal GTCV by correcting a gain temperature characteristic of the digital input signal S3 (signal value: VIN) according to the digital temperature signal S4 (signal value: T).

The offset temperature characteristic correction unit 120 generates an output signal VOUT_TC by correcting an offset temperature characteristic of the input signal GTCV according to the digital temperature signal S4.

The gain/offset absolute amount correction unit 130 is provided at stage after the offset temperature characteristic correction unit 120, and generates the digital output signal S5 (signal value: VOUT) by correcting a gain/offset absolute amount of the output signal VOUT_TC.

<Offset Temperature Characteristic Correction Unit>

First, the offset temperature characteristic correction unit 120 will be described in detail. The offset temperature characteristic correction unit 120 of the present configuration example includes a reference correction amount calculation unit 121, a correction coefficient calculation unit 122, a multiplication unit 123, and a subtraction unit 124. The offset temperature characteristic correction unit 120 corrects the offset temperature characteristic of the input signal GTCV by using a two-parameter correction algorithm in accordance with an input signal characteristic at a specific temperature and a temperature characteristic at a specific input signal.

The reference correction amount calculation unit 121 calculates a reference correction amount TCV_REF with respect to the input signal GTCV based on the input signal characteristic at a specific temperature. Specifically, the reference correction amount calculation unit 121 calculates the reference correction amount TCV_REF by using a first approximate formula (TCV_REF=AV1×GTCV$^2$+BV1×GTCV+CV1). The first approximate formula is a second-degree function of the input signal GTCV derived from a correlation between sensor input signal value Vi@20° C. at a reference temperature (T=20° C., for example) and sensor input signal variation amount ΔVi@60° C. at a specific temperature(T=60° C., for example) from the sensor input signal value Vi@20° C. (=Vi@60° C.−Vi@20° C.) as a reference (detailed description will be given later). Coefficients and an intercept (AV1, BV1, CV1) of the first approximate formula are each stored in the storage unit 19 as part of the first correction parameter S10.

The correction coefficient calculation unit 122 calculates a correction coefficient TCR at a current temperature T based on a reference correction amount temperature characteristic at a specific input signal. Specifically, the correction coefficient calculation unit 122 calculates the correction coefficient TCR by using a second approximate formula (TCR=AT1×T$^2$+BT1×T+CT1). The second approximate formula is a second-degree function of the temperature T derived from a correlation between temperature T and input signal variation ratio at a specific input signal (Vi@20° C.=1.5 V, for example) normalized based on the input signal variation amount ΔVi@60° C. at a specific temperature (T=60° C., for example) (a detailed description will be given later). Coefficients and an intercept (AT1, BT1, CT1) of the second approximate formula are each stored in the storage unit 19 as part of the first correction parameter S10.

The multiplication unit 123 calculates a correction amount TCV (=TCV_REF×TCR) by multiplying the reference correction amount TCV_REF and the correction coefficient TCR together.

The subtraction unit 124 generates the output signal VOUT_TC (=GTCV−TCV) by subtracting the correction amount TCV from the input signal GTCV.

<Correction Algorithm (Basic)>

Figure 3:
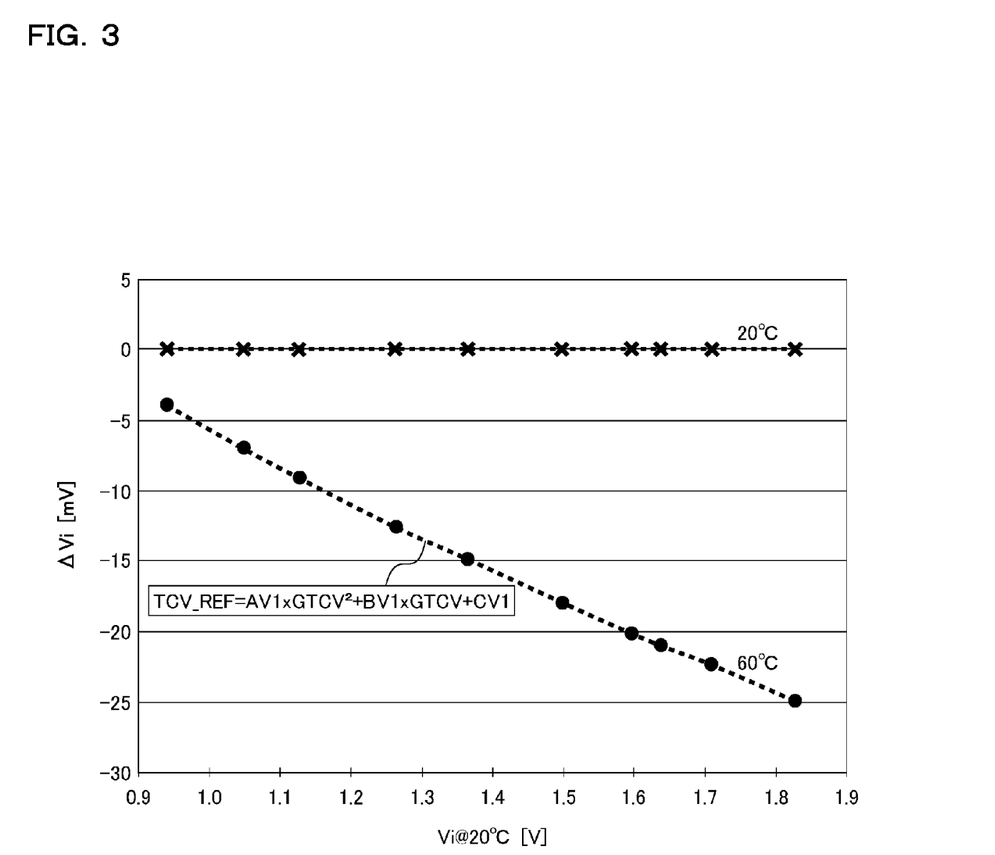
FIG. 3 is a correlation diagram showing a correlation between Vi@20° C. and ΔVi(@20° C., @60° C.)

Next, a detailed description will be given of a basic concept of the correction algorithm (temperature characteristic correction performed by using an approximate formula) adopted in the offset temperature characteristic correction unit 120, dealing with specific examples. FIG. 3 is a correlation diagram showing a correlation between Vi@20° C. and ΔVi(@20° C., @60° C.).

As shown in the present figure, when the sensor input signal value at 20° C., Vi@20° C. (indicated by crosses), is a reference, the sensor input signal variation amount at 60° C., ΔVi@60° C. (indicated by solid black dots), has a negative value at any point within an input range of the sensor input signal Vi (0.9 V through 1.9 V, for example). That is, at the time of measurement at 60° C., the sensor input signal Vi is offset to a minus side (a low-voltage side) as compared with at the time of measurement at 20° C. For example, Vi@60° C.=1.483 V (=1.5 V−17 mV) when Vi@20° C.=1.5 V.

Here, as for the input signal characteristic at 60° C. (a correlation between Vi@20° C. and ΔVi@60° C.), a second-degree approximate formula (corresponding to the first approximate formula described above) representing the input signal characteristic at 60° C. can be derived by using a method of least squares (see a broken line connecting the solid black dots). Consequently, use of this second-degree approximate formula makes it possible to estimate the sensor input signal variation amount ΔVi@60° C. with respect to the sensor input signal Vi, and thus to make Vi@60° C. equivalent to Vi@20° C. by subtracting the estimated value from the sensor input signal Vi. The above-mentioned approximate formula is not limited to a second-degree approximate formula, but it may instead be a first-degree approximate formula or a third- or higher-degree approximate formula.

It should be noted, however, that the above-mentioned second-degree approximate formula (the first approximate formula), which is derived from the input signal characteristic at 60° C. (the correlation between Vi@20° C. and ΔVi@60° C.), is applied only to the temperature characteristic correction at 60° C. Thus, if the above-described correction algorithm is simply expanded to perform the temperature characteristic correction over a whole operation temperature range, there arises a need to prepare a large number of approximate formulae, and the need requires an unrealistic circuit scale (storage capacity) of the storage unit 19.

To overcome this inconvenience, in the offset temperature characteristic correction unit 120, the offset temperature characteristic of the input signal GTCV is corrected by using a two-parameter correction algorithm in accordance not only with the input signal characteristic at a specific temperature (T=60° C., for example) but also with the temperature characteristic at a specific input signal (Vi@20° C.=1.5 V, for example). Hereinafter, a detailed description will be given in this regard, dealing with specific examples.

<Correction Algorithm (with two parameters)>

Figure 4:
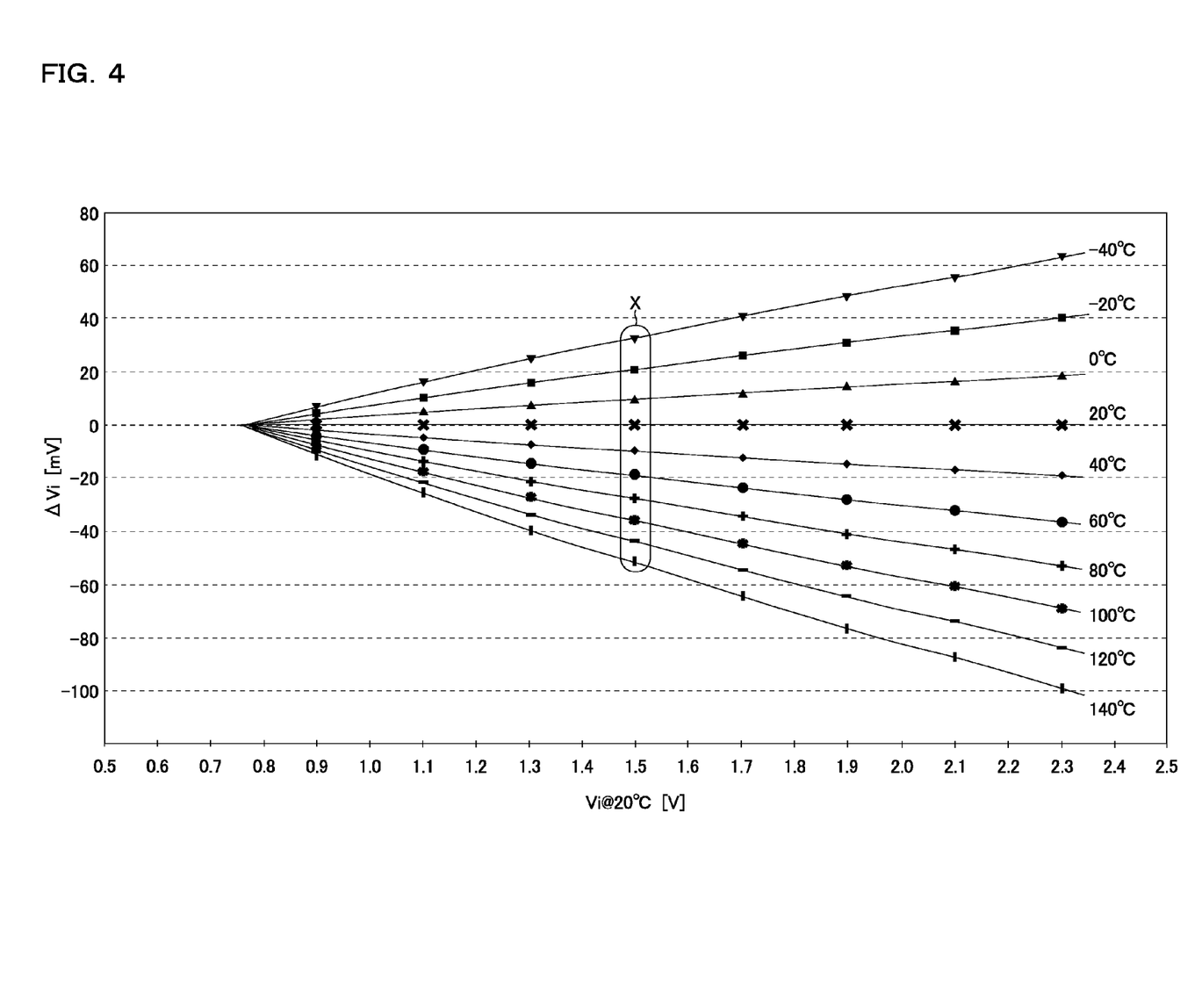
FIG. 4 is a correlation diagram showing a correlation between Vi@20° C. and ΔVi(@−40° C. through @140° C.)

FIG. 4 is a correlation diagram showing a correlation between Vi@20° C. and ΔVi (@−40° C. through @140° C.). As shown in the present figure, when the sensor input signal value at 20° C., Vi@20° C. (indicated by the crosses), is a reference, in a temperature range above 20° C., the sensor input signal variation amount ΔVi(@40° C. through 140° C.) has negative values. In contract, in a temperature range below 20° C., the sensor input signal variation amount ΔVi(@−40° C. through 0° C.) has positive values.

Target specifications of the offset temperature characteristic correction unit 120 are such that the sensor input signal variation amount ΔVi(@40° C. through 140° C.) is 0 mV in a whole input range of the sensor input signal Vi (0.5V through 2.5V) and in the whole operation temperature range (−40° C. through 140° C.).

In order to achieve a two-parameter correction algorithm, it is necessary to derive each of the first approximate formula (TCV_REF=AV1×GTCV$^2$+BV1×GTCV+CV1) representing the input signal characteristic at 60° C., and the second approximate formula (TCR=AT1×T$^2$+BT1×T+CT1) representing the temperature characteristic at Vi@20° C.=1.5V, and to store the coefficients and the intercepts (AV1, BV1, CV1, AT1, BT1, CT1) of the first and second approximate formulae in the storage unit 19 in advance.

The method for deriving the first approximate formula (method for calculating AV1, BV1, CV1) is as has been described above with reference to FIG. 3. Thus, hereafter, a detailed description will be given of a method for deriving the second approximate formula (a method for calculating AT1, BT1, and CT1), dealing with specific examples.

Figure 5:
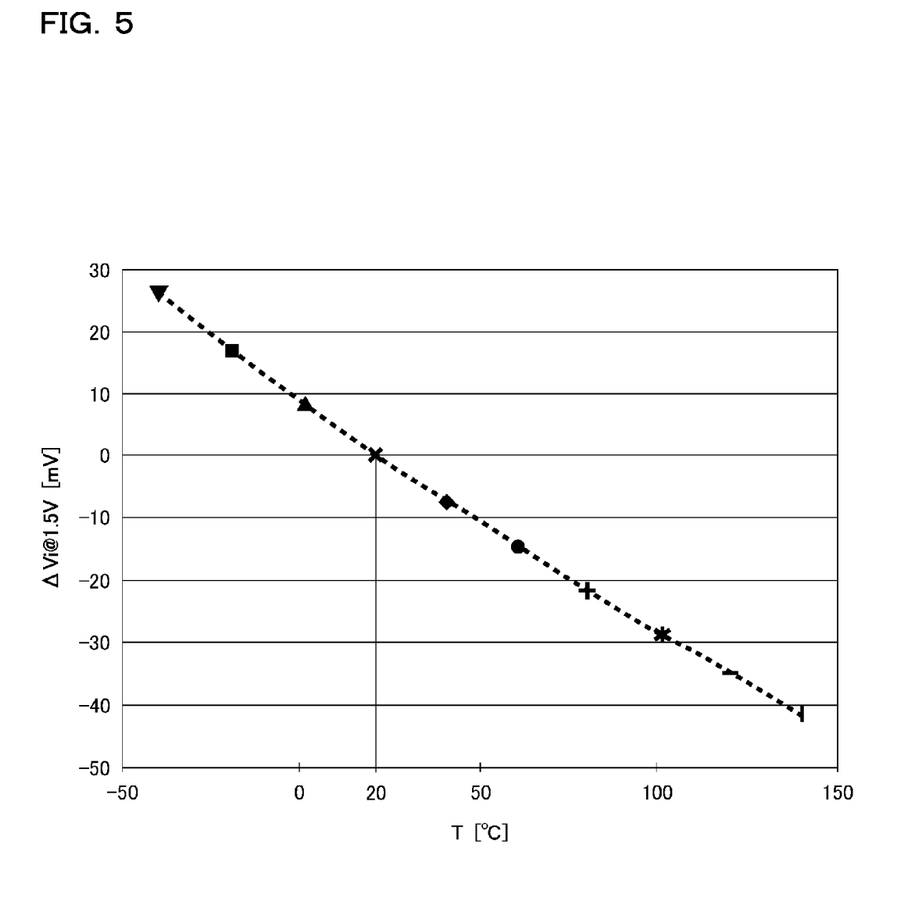
FIG. 5 is a correlation diagram showing a correlation between T and ΔVi@1.5 V.

FIG. 5 is a correlation diagram showing a correlation between temperature T and sensor input signal variation amount ΔVi@1.5V at the specific input signal (Vi@20° C.=1.5V). That is, FIG. 5 is obtained by replotting FIG. 4 into a graph in which the vertical axis represents the sensor input signal variation amount ΔVi at each temperature (−40° C. through 140° C.) when Vi@20° C.=1.5 V (see part X in a thin-line frame) and the horizontal axis represents the temperature T.

Figure 6:
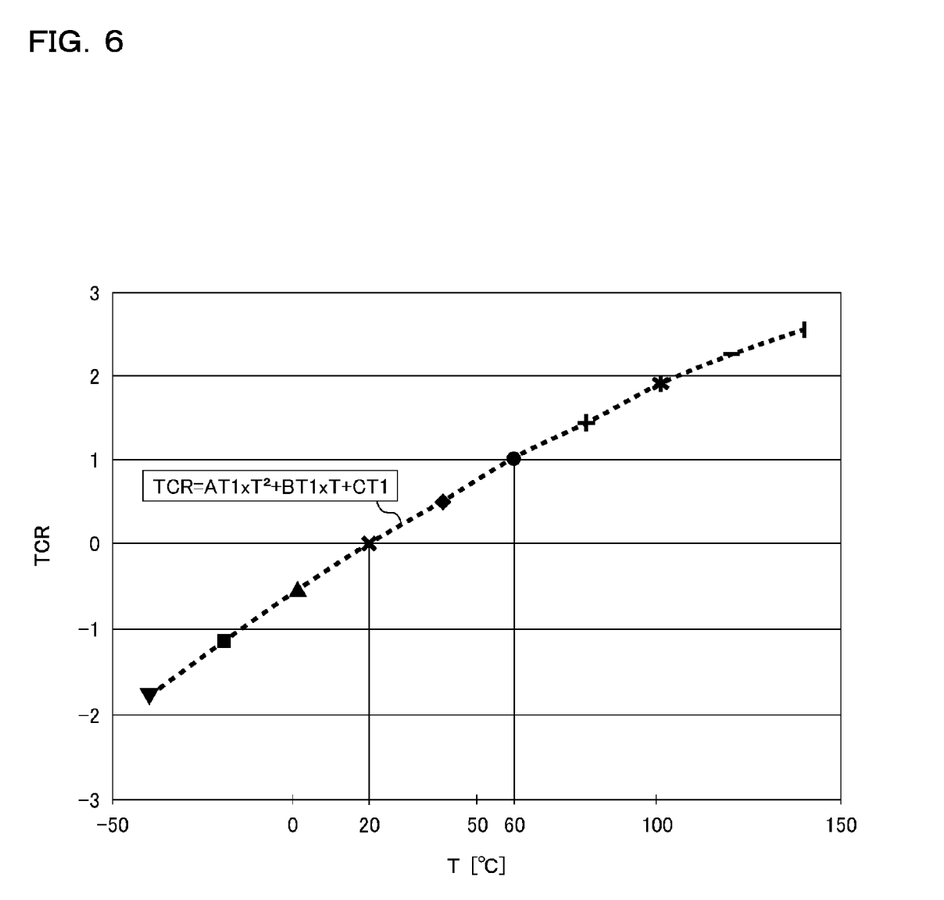
FIG. 6 is a correlation diagram showing a correlation between T and TCR.

Further, by normalizing FIG. 5 based on the input signal variation amount ΔVi@60° C., FIG. 6 is obtained. Here, the input signal variation ratio (vertical axis) after the normalization is an index value indicating how much the reference correction amount TCV_REF at 60° C. reference calculated by using the previously described first approximate formula varies according to the temperature T, and it is referred to as the correction coefficient TCR for adjusting the reference correction amount TCV_REF according to the temperature T. In that sense, it can be said that FIG. 6 is a correlation diagram showing a correlation between temperature T and correction coefficient TCR.

For example, TCR is 1.35 (=−23 mV/−17 mV) when ΔVi@60° C.≡−17 mV and ΔVi@80° C.≡−23 mV. Likewise, TCR is −0.94 (=16 mV/−17 mV) when ΔVi@−20° C.≡16 mV. Incidentally, TCR at 60° C. is 1, and TCR at 20° C. is 0.

Here, as for the temperature characteristic at Vi@20° C.=1.5 V (a correlation between T and TCR), it is possible to derive a second-degree approximate formula (corresponding to the second approximate formula described above) representing the temperature characteristic by the method of least squares (see the broken line connecting the marks). Consequently, use of the second-degree approximate formula makes it possible to calculate the correction coefficient TCR in accordance with the temperature T, and thus to calculate the correction amount TCV applicable also to temperature characteristic correction at any temperature in addition to 60° C. by multiplying the reference correction amount TCV_REF by the calculated correction coefficient TCR. Note that the above-mentioned approximate formula is not limited to a second-degree approximate formula, but it may instead be a first-degree approximate formula or a third- or higher-degree approximate formula.

For example, assume a case where T=100° C. and GTCV=1.2 V. In this case, a result obtained by calculation at the reference correction amount calculation unit 121 and a result obtained by calculation at the correction coefficient calculation unit 122 are TCV_REF≡−11 mV (see FIG. 3) and TCR≡1.9 (see FIG. 6), respectively, and thus TCV≡−20.9 mV (=−11 mV×1.9) is obtained as a result of calculation at the multiplication unit 123. The correction amount TCV calculated in this manner has sufficient consistency with measurement result shown in FIG. 4. Thus, by subtracting the correction amount TCV from the input signal GTCV at the subtraction unit 124, it is possible to generate the output signal VOUT_TC where the offset temperature characteristic is appropriately canceled.

Thus, adoption of the two-parameter correction algorithm makes it possible to perform temperature characteristic correction with respect to a whole operation temperature range without preparing a large number of approximate formulae, and thus to reduce the circuit scale of the storage unit 19, which contributes to reduction in size and cost of the signal processor.

As has been discussed above, with a two-parameter correction algorithm, the offset temperature characteristic of the input signal GTCV is corrected according to the input signal characteristic at a specific temperature and the temperature characteristic at a specific input signal. In the correction, it is desirable to set the above-mentioned specific temperature and specific input signal to be near a mean value of the operation range. Specifically, it is desirable to set the temperature T to a temperature from 40° C. through 60° C. close to a mean value of the operation temperature range (−40° C. through 140° C.), and it is desirable to set the sensor input signal Vi to a value (1.4 V through 1.6 V) close to a mean value of a sensor output range (0.5 V through 2.5 V).

<Gain Temperature Characteristic Correction Unit>

Next, referring back to FIG. 2, a description will be given of the gain temperature characteristic correction unit 110. The gain temperature characteristic correction unit 110 of the present configuration example includes a gain correction amount calculation unit 111 and an addition unit 112.

The gain correction amount calculation unit 111 calculates a gain correction amount GTCR at a current temperature T by using a third approximate formula (GTCR=1−(A3×T$^2$+B3×T+C3)) representing a correlation between temperature T and gain correction amount GTCR. Coefficients and an intercept (A3, B3, C3) of the third approximate formula are each stored in the storage unit 19 as part of the first correction parameter S10.

The addition unit 112 generates the input signal GTCV (=VIN×GTCR) by multiplying the input signal S3 (signal value: VIN) by the gain correction amount GTCR.

<Gain/Offset Absolute Amount Correction Unit>

Next, referring back to FIG. 2 again, a description will be given of the gain/offset absolute amount correction unit 130. The gain/offset absolute amount correction unit 130 of the present configuration example corrects the gain/offset absolute amount of the output signal VOUT_TC by using a fourth approximate formula (VOUT=A2×VOUT_TC$^2$+B2×VOUT_TC+C2) representing a correlation between output signal VOUT_TC and digital output signal S5 (signal value: VOUT). Coefficients and an intercept (A2, B2, C2) of the fourth approximate formula are each stored in the storage unit 19 as part of the first correction parameter S10.

<Pulse Count Number Setting Circuit>

Figure 7:
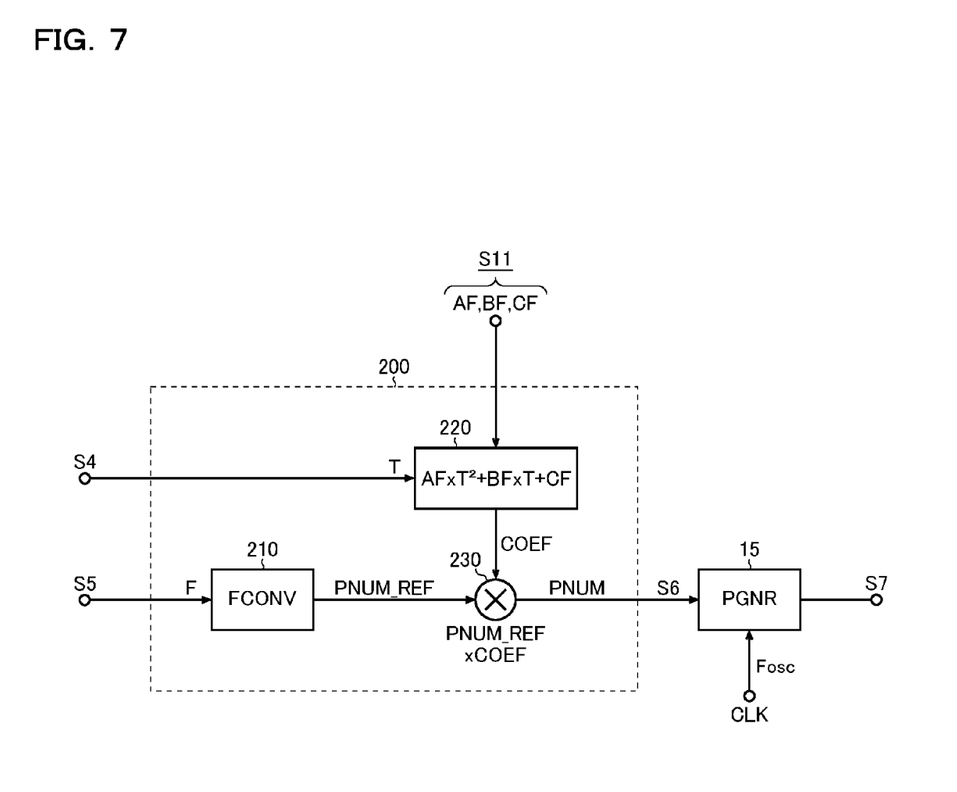
FIG. 7 is a block diagram showing a configuration example of a pulse count number setting circuit.

FIG. 7 is a block diagram showing a configuration example of the pulse count number setting circuit 200. The pulse count number setting circuit 200 of the present configuration example includes a reference pulse count number setting unit 210, a correction coefficient calculation unit 220, and a multiplication unit 230.

In particular, the pulse count number setting circuit 200 of the present configuration example is equipped with a function of correcting the pulse count number setting signal S6 by referring to the digital temperature signal S4 (signal value: T) and the second correction parameter (AF, BF, CF) so as to cancel a frequency temperature characteristic of the first pulse signal S7 (and thus a frequency temperature characteristic of the reference clock signal CLK) in generating the pulse count number setting signal S6 in accordance with the digital output signal S5.

The reference pulse count number setting unit 210 sets a reference pulse count number PNUM_REF according to the digital output signal S5 (signal value: F). More specifically, the reference pulse count number setting unit 210 sets the reference pulse count number PNUM_REF such that the higher the signal value F of the digital output signal S5 (a frequency value in accordance with the sensor input signal Vi) is, the smaller the reference pulse count number PNUM_REF is, that is, conversely, such that the lower the signal value F of the digital output signal S5 is, the larger the reference pulse count number PNUM_REF is.

The correction coefficient calculation unit 220 calculates the correction coefficient COEF at a current temperature T based on the frequency temperature characteristic of the reference clock signal CLK. More specifically, the correction coefficient calculation unit 220 calculates the correction coefficient COEF at the current temperature T by referring to the digital temperature signal S4 (signal value: T) and the second correction parameter S11 (AF, BF, CF) and using an approximate formula ($\Delta Fosc = AF \times T^2 + BF \times T + CF$) derived from a correlation between temperature T and oscillation frequency variation amount $\Delta Fosc$(%) of the reference clock signal CLK. Coefficients and an intercept (AF, BF, CF) of the above approximate formula are each stored in the storage unit 19 as part of the second correction parameter S11.

The multiplication unit 230 generates the pulse count number setting signal S6 (pulse count number PNUM (=PNUM_REF×COEF)) by multiplying the reference pulse count number PNUM_REF and the correction coefficient COEF together.

The pulse generation unit 15 generates the first pulse signal S7 by counting the pulse number of the reference clock signal CLK (oscillation frequency: Fosc) according to the pulse count number setting signal S6. More specifically, the pulse generation unit 15 performs pulse generation of the first pulse signal S7 each time the pulse number of the reference clock signal CLK reaches the pulse count number PNUM. Thus, it can be said that the pulse generation unit 15 is a frequency divider that generates the first pulse signal S7 by dividing frequency of the reference clock signal CLK with a frequency division ratio (1/PNUM) in accordance with the pulse count number PNUM. Accordingly, the smaller the pulse count number PNUM is, the higher the oscillation frequency (Fosc/PNUM) of the first pulse signal S7 is, and conversely, the larger the pulse count number PNUM is, the lower the oscillation frequency (Fosc/PNUM) of the first pulse signal S7 is.

<Correction Algorithm>

Figure 8:
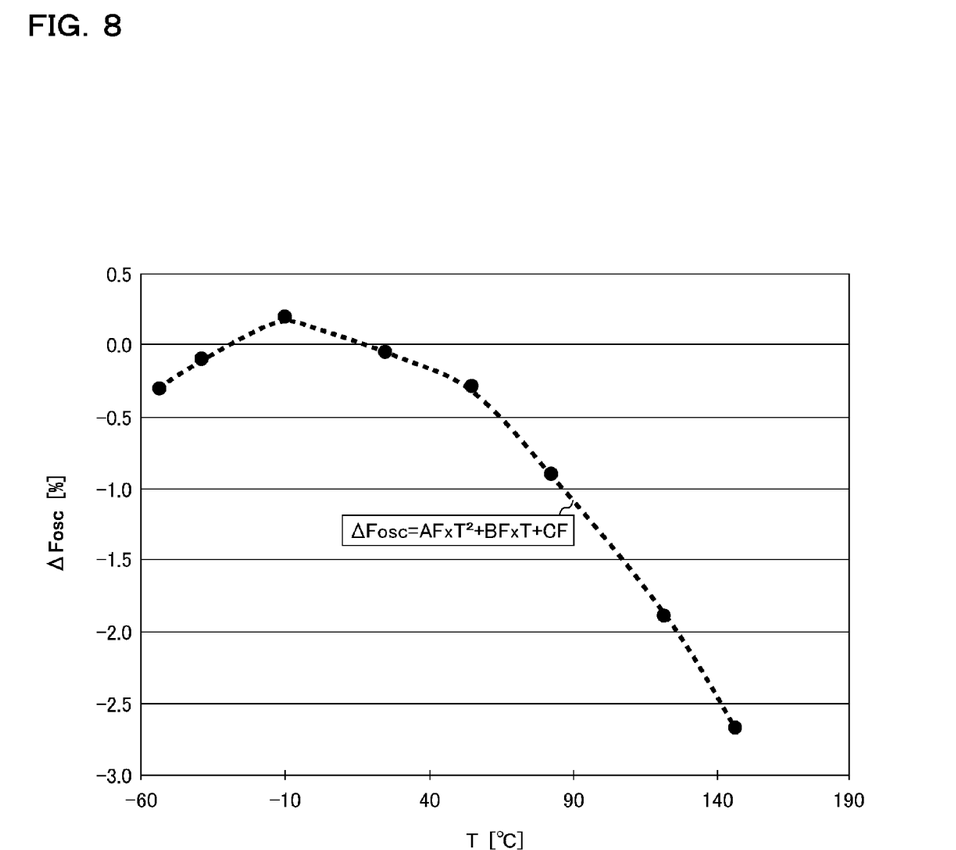
FIG. 8 is a correlation diagram between T and ΔFosc.

Next, a detailed description will be given of a basic concept of the correction algorithm (temperature characteristic correction performed by using an approximate formula) adopted in the pulse count number setting circuit 200, dealing with specific examples. FIG. 8 is a correlation diagram showing a correlation between temperature T and oscillation frequency variation amount $\Delta Fosc$(%).

As shown in the present figure, as for the frequency temperature characteristic (correlation between T and $\Delta Fosc$) of the reference clock signal CLK, it is possible to derive a second-degree approximate formula ($\Delta Fosc = AF \times T^2 + BF \times T + CF$) representing the frequency temperature characteristic of the reference clock signal CLK by the method of least squares (see the broken line connecting the solid black dots). Note that the above-mentioned approximate formula is not limited to a second-degree approximate formula, but it may instead be a first-degree approximate formula or a third- or higher-degree approximate formula. Calculation of the second-degree approximate formula and storage processing of the second correction parameter S11 (AF, BF, CF) may be performed in advance during a pre-shipping test.

Use of the above second-degree formula makes it possible to estimate the oscillation frequency variation amount $\Delta Fosc$ at the current temperature T, and thus to easily calculate the correction coefficient COEF (=100%+$\Delta Fosc$) that is necessary to cancel the frequency temperature characteristic of the reference clock signal CLK.

For example, COEF=99.9% when $\Delta Fosc$=−0.1%, and COEF=100.1% when $\Delta Fosc$=+0.1%. That is, the pulse count number setting circuit 200 performs correction processing of the pulse count number setting signal S6 such that the higher the oscillation frequency Fosc of the reference clock signal CLK is, the larger the pulse count number PNUM is set to reduce the oscillation frequency (=Fosc/PNUM) of the first pulse signal S7, that is, conversely, such that the lower the oscillation frequency Fosc of the reference clock signal CLK is, the smaller the pulse count number PNUM is set to raise the oscillation frequency (=Fosc/PNUM) of the first pulse signal S7.

<Generation and Correction of Frequency Drift>

A detailed description will be given below of a generation mechanism of frequency drift attributable to the frequency temperature characteristic of the reference clock signal CLK and an operation of correcting the frequency drift, dealing with more specific examples.

Figure 9:
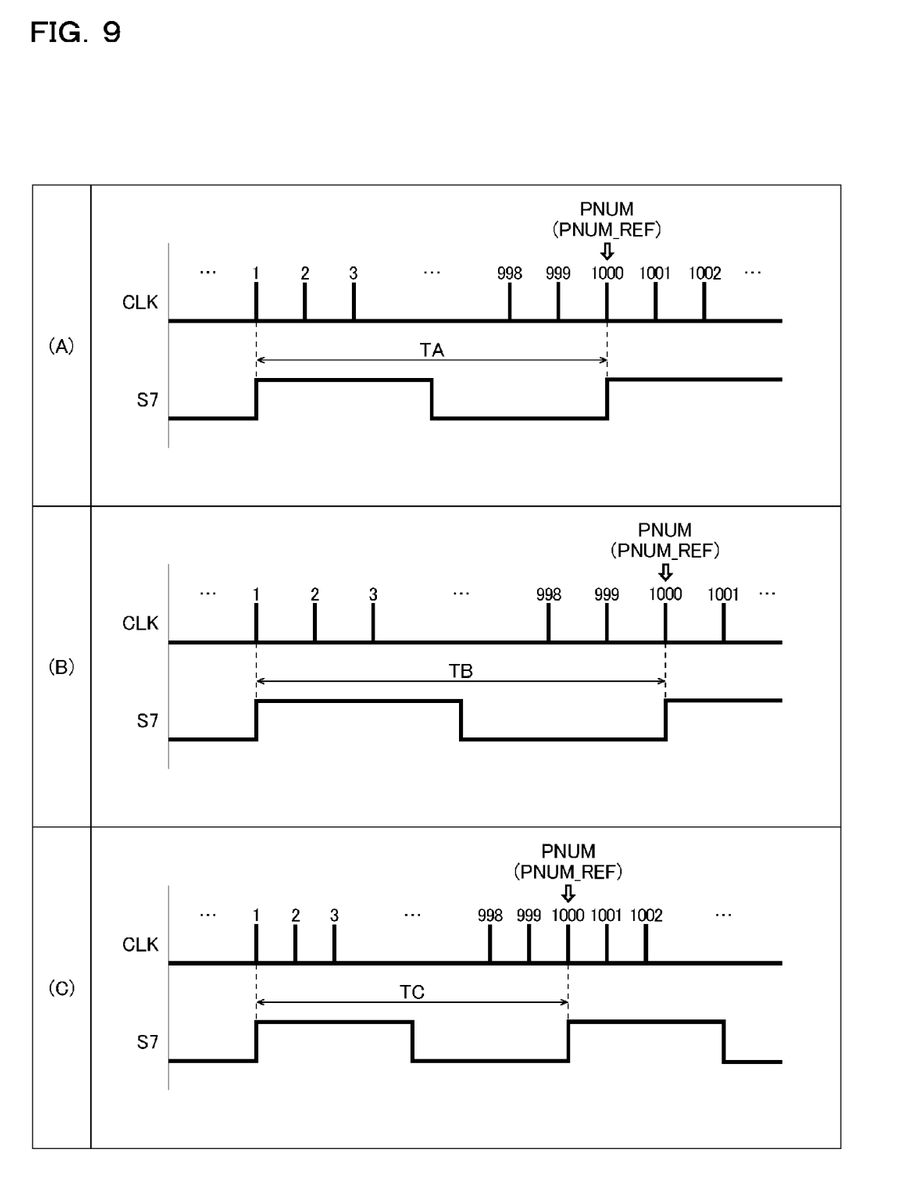
FIG. 9 is a timing chart for illustrating a generation mechanism of frequency drift.

FIG. 9 is a timing chart for illustrating the generation mechanism of frequency drift, with the reference clock signal CLK and the first pulse signal S7 illustrated in each of boxes (A), (B), and (C). Here, the box (A) shows how the signals behave when the oscillation frequency Fosc is at an ideal value, the box (B) shows how the signals behave when the oscillation frequency Fosc is deviated below from the ideal value, and the box (C) shows how the signals behave when the oscillation frequency Fosc is deviated above from the ideal value.

The present figure shows the behavior as observed with the reference pulse count number PNUM_REF used as the pulse count number PNUM as it is without any correction. In this case, the pulse count number PNUM does not depend on the frequency temperature characteristic of the reference clock signal CLK, but is fixed to a value (here, 1000) in accordance with the digital output signal S5 (and thus the sensor input signal Vi).

Thus, when the oscillation frequency Fosc of the reference clock signal CLK is deviated below from the ideal value, the first pulse signal S7 has a period longer than at the ideal value (TB>TA), and, in contrast, when the oscillation frequency Fosc is deviated above from the ideal value, the first pulse signal has a period shorter than at the ideal value (TC<TA).

Thus, when the reference pulse count number PNUM_REF is used as the pulse count number PNUM as it is without any correction, frequency drift of the first pulse signal S7 is caused attributable to the frequency temperature characteristic of the reference clock signal CLK.

Figure 10:
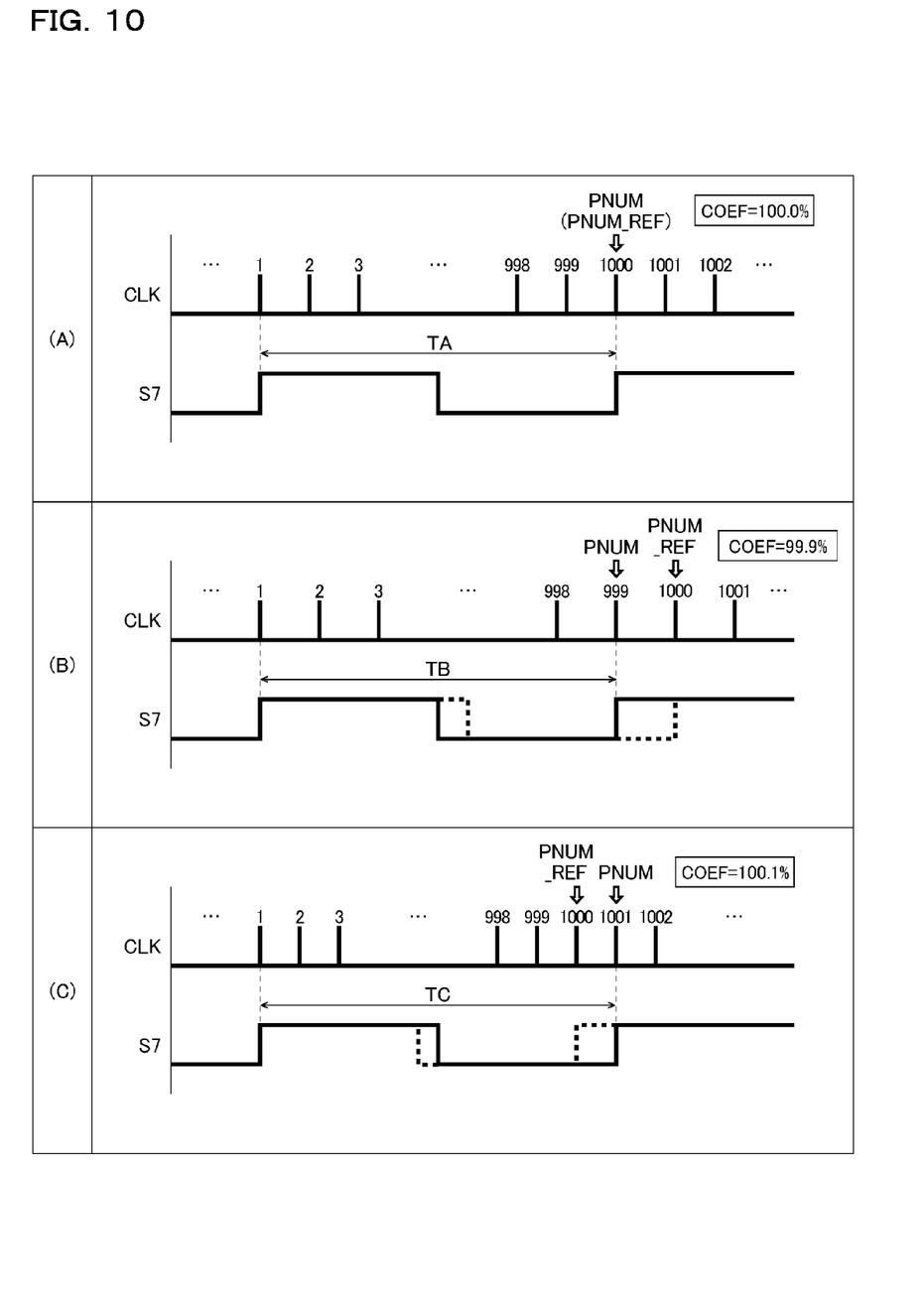
FIG. 10 is a timing chart for illustrating an operation of correcting frequency drift.

FIG. 10 is a timing chart for illustrating the operation of correcting the above-described frequency drift, with the reference clock signal CLK and the first pulse signal S7 illustrated in each of boxes (A), (B), and (C) in the same manner as in the above referred-to FIG. 9. Here, the box (A) shows how the signals behave when the oscillation frequency Fosc is at the ideal value, the box (B) shows how the signals behave when the oscillation frequency Fosc is deviated below from the ideal value, and the box (C) shows how the signals behave when the oscillation frequency Fosc is deviated above from the ideal value.

The present figure shows behaviors in a case where the pulse count number PNUM is obtained by multiplying the reference pulse count number PNUM_REF by the correction coefficient COEF. In this case, the pulse count number PNUM is increased or reduced from the reference pulse count number PNUM_REF (1000, here) so as to cancel the frequency temperature characteristic of the reference clock signal CLK.

A specific description will be given according to the examples shown in the present figure. For example, in a case where the oscillation frequency Fosc of the reference clock signal CLK is deviated below from the ideal value by 0.1% (ΔFosc=−0.1%), COEF=99.9%, and thus PNUM=999 with respect to PNUM_REF=1000. Accordingly, a period TB of the first pulse signal S7 is shortened by 0.1% compared with a case without correction, and thus is equal to a period TA, which is the period that the first pulse signal S7 has when the oscillation frequency Fosc is at the ideal value. Conversely, in a case where the oscillation frequency Fosc of the reference clock signal CLK is deviated above from the ideal value by o.1% (ΔFosc=+0.1%), COEF=100.1%, and thus PNUM=1001 with respect to PNUM_REF=1000. Accordingly, the period TB of the first pulse signal S7 is prolonged by 0.1% compared with the case without correction, and thus is equal to the period TA, which is the period that the first pulse signal S7 has when the oscillation frequency Fosc is at the ideal value.

Thus, in the signal processor 10 of the present configuration example, since the pulse count number setting signal S6 is corrected so as to cancel the frequency temperature characteristic of the first pulse signal S7 (and thus the frequency temperature characteristic of the reference clock signal CLK), it is possible to reduce frequency drift of the first pulse signal S7 without using a highly accurate oscillator, and thus to improve the output accuracy of the signal processor 10.

Furthermore, with the signal processor 10 of the present configuration example, it is easier to perform adjustment suitable for temperature characteristics of actual circuits than with the conventional measures taken at the time of design such that a frequency temperature characteristic of an oscillator is canceled by using combination of resistor elements each having a positive or negative temperature characteristic, etc.

Moreover, with the signal processor 10 of the present configuration example, where the pulse count number setting signal S6 is corrected by using an approximate formula derived from the frequency temperature characteristic of the reference clock signal CLK, it is possible to reduce the circuit scale (storage capacity) of the storage unit 19 as compared with map correction performed by using look-up tables, etc.

<Other Modified Examples>

In addition to the above embodiments, it is possible to add various modifications to the various technical features disclosed herein without departing the spirit of the technological creation. In other words, it should be understood that the above embodiments are examples in all respects and are not limiting; the technological scope of the present invention is not indicated by the above description of the embodiments but by the claims; and all modifications within the scope of the claims and the meaning equivalent to the claims are covered.

INDUSTRIAL APPLICABILITY

The present invention is applicable, for example, to a signal processor that generates an output signal in accordance with an input signal.

What is claimed is:

1. A signal processor comprising:
   a pulse count number setting circuit operable to generate a pulse count number setting signal in accordance with an input signal; and
   a pulse generation unit operable to generate a pulse signal by counting a pulse number of a reference clock signal according to the pulse count number setting signal,
   wherein the pulse count number setting circuit is operable to correct the pulse count number setting signal so as to cancel a frequency temperature characteristic of the pulse signal,
   wherein the pulse count number setting circuit includes:
      a reference pulse count number setting unit operable to set a reference pulse count number according to a signal value of the input signal,
      a correction coefficient calculation unit operable to calculate a correction coefficient at a current temperature based on a frequency temperature characteristic of the reference clock signal, and
      a multiplication unit operable to generate the pulse count number setting signal by multiplying the reference pulse count number and the correction coefficient together.

2. The signal processor according to claim 1, wherein the correction coefficient calculation unit calculates the correction coefficient by using an approximate formula derived from a correlation between temperature and oscillation frequency variation amount of the reference clock signal.

3. The signal processor according to claim 2, further comprising a storage unit that stores therein a correction parameter representing the approximate formula in a non-volatile manner.

4. The signal processor according to claim 1, wherein the pulse count number setting circuit is achieved by digital processing at a logic unit.

5. The signal processor according to claim 1, wherein the pulse signal is a frequency signal having an oscillation frequency in accordance with the input signal.

6. The signal processor according to claim 1, further comprising an open drain output unit that outputs an output signal according to the pulse signal.

7. The signal processor according to claim 1, further comprising a temperature detection unit that generates a temperature detection signal in accordance with temperature.

8. An electronic apparatus, comprising:
   a signal source that generates an input signal;
   the signal processor according to claim 1 that generates an output signal from the input signal; and
   a controller that accepts an input of the output signal.

9. The electronic apparatus according to claim 8, wherein the signal source is a sensor.

* * * * *